United States Patent [19]

Manada et al.

[11] Patent Number: 5,525,156
[45] Date of Patent: Jun. 11, 1996

[54] APPARATUS FOR EPITAXIALLY GROWING A CHEMICAL COMPOUND CRYSTAL

[75] Inventors: Nobuaki Manada, 1-24, Yagiyamaminami 1-chome, Taihaku-ku, Sendai-shi, Miyagi-ken; Junji Ito, 16-3, Yagiyamamidori-cho, Taihaku-ku, Sendai-shi, Miyagi-ken; Toru Kurabayashi, 9-23, Yagiyamaminami 1-chome, Taihaku-ku, Sendai-shi, Miyagi-ken; Jun-Ichi Nishizawa, 6-16, Komegafukuro 1-chome, Aoba-ku, Sendai-shi, Miyagi-ken, all of Japan

[73] Assignees: Research Development Corporation; Nobuaki Manada; Junji Ito; Toru Kurabayashi; Jun-Ichi Nichizawa, all of, Japan

[21] Appl. No.: 401,495

[22] Filed: Mar. 10, 1995

Related U.S. Application Data

[63] Continuation-in-part of Ser. No. 197,558, Feb. 17, 1994, abandoned, which is a continuation of Ser. No. 617,554, Nov. 26, 1990, abandoned.

[30] Foreign Application Priority Data

Nov. 24, 1989 [JP] Japan ................................. 1-305873

[51] Int. Cl.$^6$ ................................. C23C 16/00
[52] U.S. Cl. ........................ 118/715; 118/708; 118/712; 427/10

[58] Field of Search ................................. 118/708, 712, 118/715; 427/10

[56] References Cited

U.S. PATENT DOCUMENTS

| | | | |
|---|---|---|---|
| 4,260,649 | 4/1981 | Dension | 118/730 |
| 4,640,720 | 2/1987 | Foxon | 156/612 |
| 4,676,646 | 6/1987 | Strand | 427/10 |
| 4,736,705 | 4/1988 | Weyburne | 118/730 |
| 4,931,132 | 6/1990 | Aspnes | 156/601 |
| 5,009,485 | 4/1991 | Hall | 427/10 |
| 5,091,320 | 2/1992 | Aspnes | 156/601 |

FOREIGN PATENT DOCUMENTS

| | | | |
|---|---|---|---|
| 64-61389 | 3/1989 | Japan | 118/722 |
| 2198152 | 6/1988 | United Kingdom . | |

*Primary Examiner*—Richard Bueker
*Attorney, Agent, or Firm*—Nixon & Vanderhye

[57] ABSTRACT

An apparatus for epitaxially growing a chemical-compound crystal, a plurality of raw-material gases are alternately introduced into a closed chamber of a crystal growing device to grow the crystal placed within the closed chamber. At growing of the crystal, a light from a light source is emitted to a crystal growing film of the crystal. Intensity of a light reflected from the crystal growing film and received by a photo detector is measured. Charge amounts of the respective raw-material gases are controlled by a control system on the basis of a change in the reflected-light intensity, thereby controlling a growing rate of the growing film.

10 Claims, 6 Drawing Sheets

1

APPARATUS FOR EPITAXIALLY GROWING A CHEMICAL COMPOUND CRYSTAL

CROSS-REFERENCE TO RELATED APPLICATIONS

This application is a continuation-in-part of application Ser. No. 08/197,558 filed Feb. 17, 1994 which is a continuation of application Ser. No. 07/617,554 filed Nov. 26, 1990, abandoned.

BACKGROUND OF THE INVENTION

The present invention relates to an apparatus for epitaxially growing a chemical-compound crystal, in which a plurality of raw-material gases are alternately introduced into a closed chamber of a crystal growing device to grow the crystal and, more particularly, to an apparatus for epitaxially growing a chemical-compound crystal, in which a growing rate of a growing film of the chemical-compound crystal is controlled during crystal growth.

In an epitaxial method for growing a chemical-compound crystal, it is very important to control the growing rate of a growing film of the crystal during crystal growth. Conventionally, in a molecular-beam epitaxial growing method, and a migration enhanced epitaxial growing method, vibration of a reflection high-energy electron diffraction (hereinafter referred to as "RHEED") is used to control the growing rate of the growing film on the order of a monomolecular layer. This is reported in the paper, Jpn. J. Appl. Phys. Vol. 23, No. 9 PPL 657- L659 (1984); T. Sakamoto et al, for example.

In practice, the crystal is grown while rotating a crystal substrate, in order to provide a uniform plane of the crystal film.

When the crystal is grown while rotating the crystal substrate as described above, the direction of the crystal axis and the direction of the high-energy electron beam both change due to the rotation of the crystal substrate. Thus, it is practically impossible to control the thickness of the growing film of the crystal by the RHEED process.

In the existing circumstances, accordingly, the thickness of the growing film of the crystal is controlled by the same conditions as growing conditions which are obtained when the crystal substrate is fixed against rotation. For this reason, it is necessary to regulate or control the amounts of the respective raw-material gases charged into the crystal growing device by crucibles. The temperatures of the crucibles are controlled extremely precisely.

However there are other problems, namely the emission of a high-energy electron beam onto the surface of the growing film gives rise to defects in the crystal. To properly use the electron beam, the interior of the crystal growing device must be maintained at super high vacuum.

SUMMARY OF THE INVENTION

It is an object of the invention to provide an apparatus for epitaxially growing a chemical-compound crystal, in which it is possible to secure uniformity in a plane of a crystal film of the crystal, in which there is no untoward influence is exerted on the crystal at growing of the crystal, and which are applicable to a wide range of pressures without limitation to super high vacuum though it is of course that the method and the apparatus can be applied to the super high vacuum.

According to the invention, there is provided a method of epitaxially growing a chemical-compound crystal, comprising the steps of:

placing the chemical-compound crystal within a closed chamber of a crystal growing device;

alternately introducing a plurality of raw-material gases into the closed chamber to grow the crystal;

at growing the crystal, emitting a light to a crystal growing film of the crystal from a predetermined direction;

measuring intensity of a light reflected from the crystal growing film; and controlling charge amounts of the respective raw-material gases on the basis of a change in the reflected-light intensity, thereby controlling the growing rate of the growing film.

According to the invention, there is further provided an apparatus for epitaxially growing a chemical-compound crystal, comprising:

a crystal growing device having defined therein a closed chamber and a vacuum evacuation device for reducing the pressure in said closed chamber to $10^{-6}$ to $10^{-11}$ Torr in communication with said closed chamber, said chemical compound being placed within said closed chamber;

a crystal rotating device for rotating said chemical compound crystal at a predetermined speed;

a heating lamp outside of the crystal growing chamber directed onto a crystal growing film;

a plurality of nozzles in a facing relationship to said crystal for alternately introducing a plurality of raw-material gases into said closed chamber to grow said crystal;

a plurality of nozzles in a facing relationship to said crystal for introducing impurity gas into said closed chamber, said raw-material gas introducing nozzles and impurity gas introducing nozzles arranged opposite each other;

incident window means provided at a periphery of said closed chamber;

light-source means emitting a predetermined wavelength light which is reflected through said crystal, said light source means being arranged on the outside of said closed chamber in facing relating to said light source means being arranged on the outside of said closed chamber in facing relating to said incident window means, for emitting a light to a crystal growing film of said crystal through said incident window means;

extracting window means provided at the periphery of said closed chamber;

light-receiving means having a predetermined angle to receive reflected light and exclude incident light, said light receiving means being arranged on the outside of said closed chamber in facing relation to said extracting window means;

means for measuring intensity of said reflected light;

oscillation intensity measurement means for measuring the light oscillation intensity;

pulse counter means for measuring the light-oscillation; and control means for controlling charge amounts of the respective raw-material gases on the basis of a change in the reflected-light intensity, thereby controlling the growth rate and the number of layers of the monomolecular layer film of said crystal.

With the above arrangement of the invention, since the intensity of the light reflected from the growing film is measured, no untoward influence is exerted on the inside of the crystal during crystal growth.

Further, since light is used, it is not necessary to retain or maintain the interior of the crystal growing device under super high vacuum conditions unlike the conventional RHEED process, though if desired the interior of the crystal growing device may be maintained under super high vacuum conditions. Since light is emitted onto the growing crystal film from the outside of the closed chamber, pressure within the closed chamber does not become an issue, so that it is possible to use the method and apparatus over a wide range of pressures including the normal pressure or pressures higher than normal.

Furthermore, since the conventional RHEED causes electron-bema diffraction, it is necessary to align the direction of the crystal axis and the direction of the high-energy electron beam with each other, so that it is impossible to grow the crystal while rotating the crystal substrate. In the method and the apparatus according to the invention, however, since the change in the reflected-light intensity has no relationship to the crystal axis, the crystal substrate may or may not be rotated during crystal growth. Thus, it is possible to secure uniformity in the plane of the crystal-film.

As described above, according to the method and the apparatus of the invention, the use of light, which is low in cost, enables one to easily and accurately control film growth rate equal to or lower than the monomolecular layer.

DETAILED DESCRIPTION OF THE DRAWINGS

Figure 6:
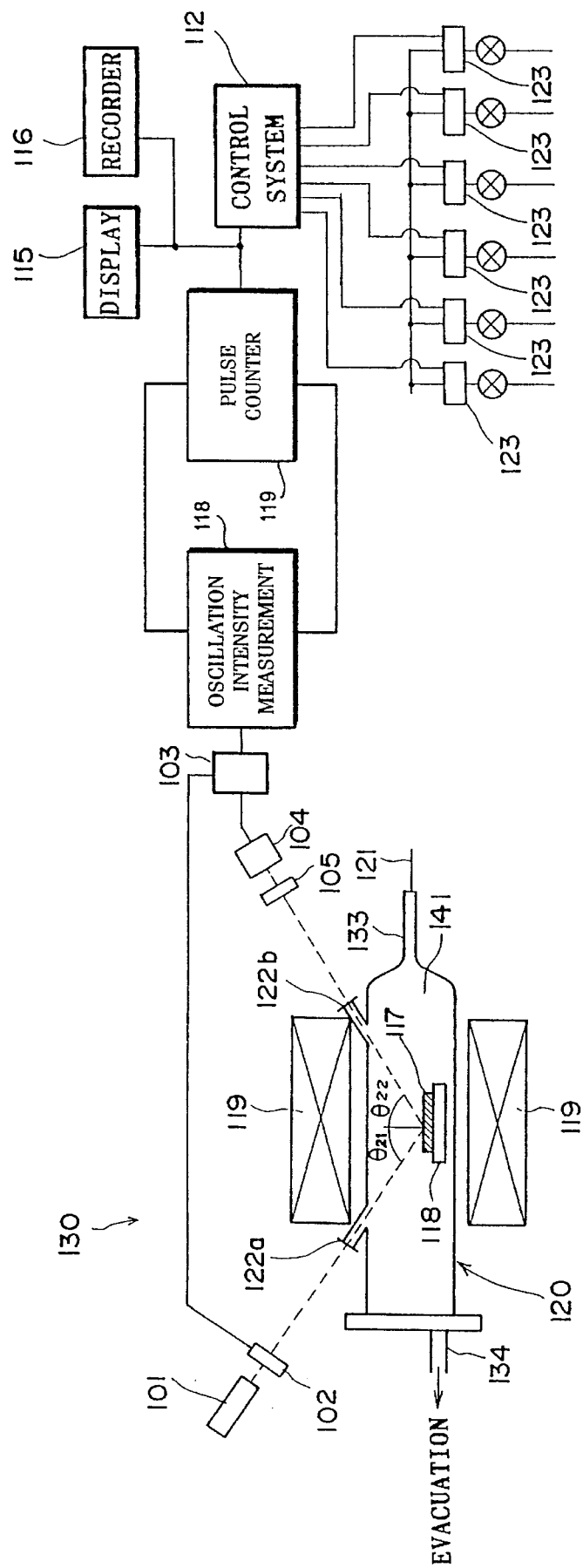
Figure 7:
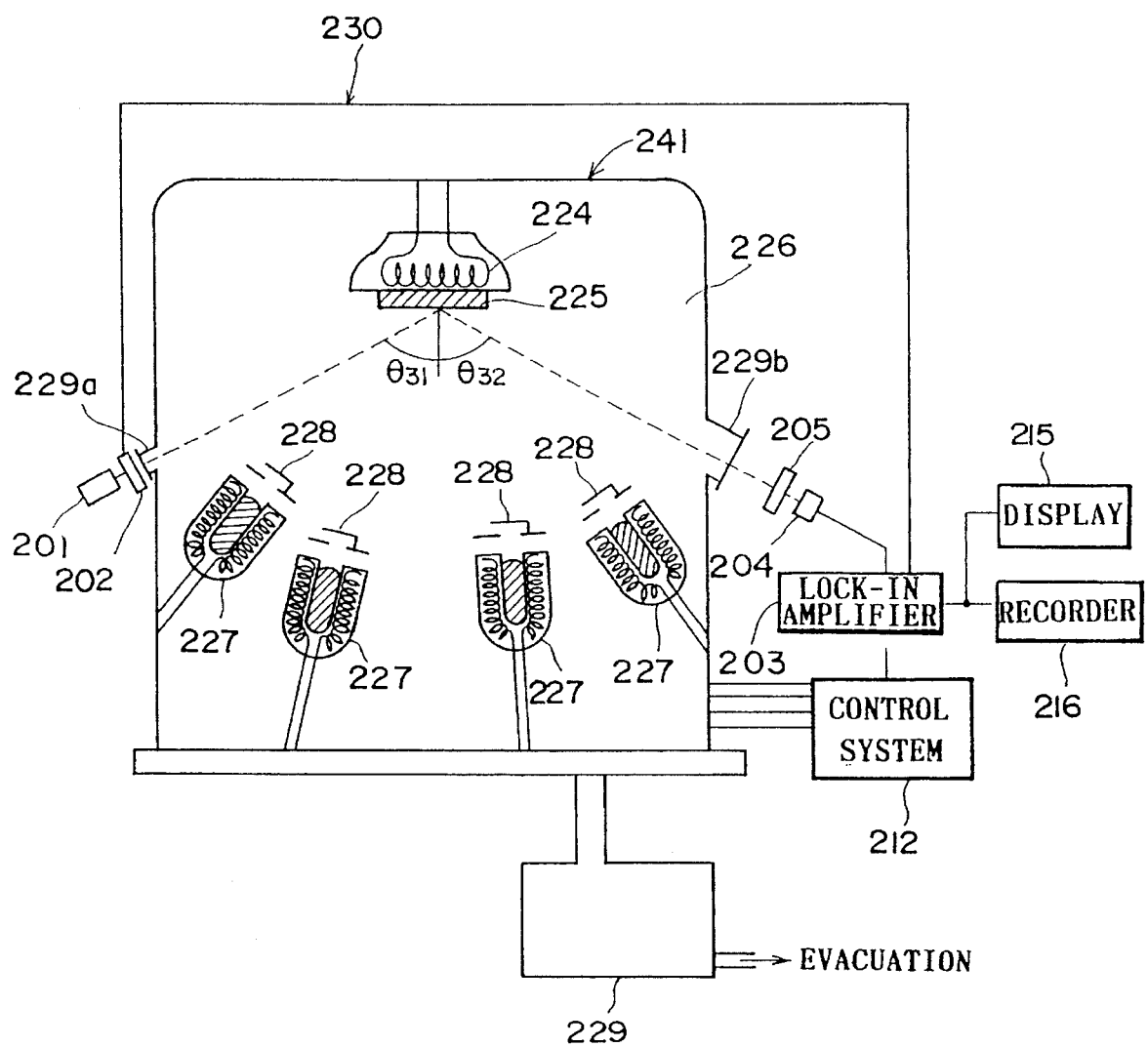

FIG. 6 is a schematic view of an epitaxial growing apparatus for epitaxial growth of a chemical-compound crystal, according to a second embodiment of the invention; and FIG. 7 is a schematic view of an epitaxial growing apparatus for epitaxial growth of a chemical-compound crystal, according to a third embodiment of the invention, the epitaxial growing apparatus comprising a molecular-beam epitaxial device.;

DESCRIPTION OF THE EMBODIMENTS

Figure 1:
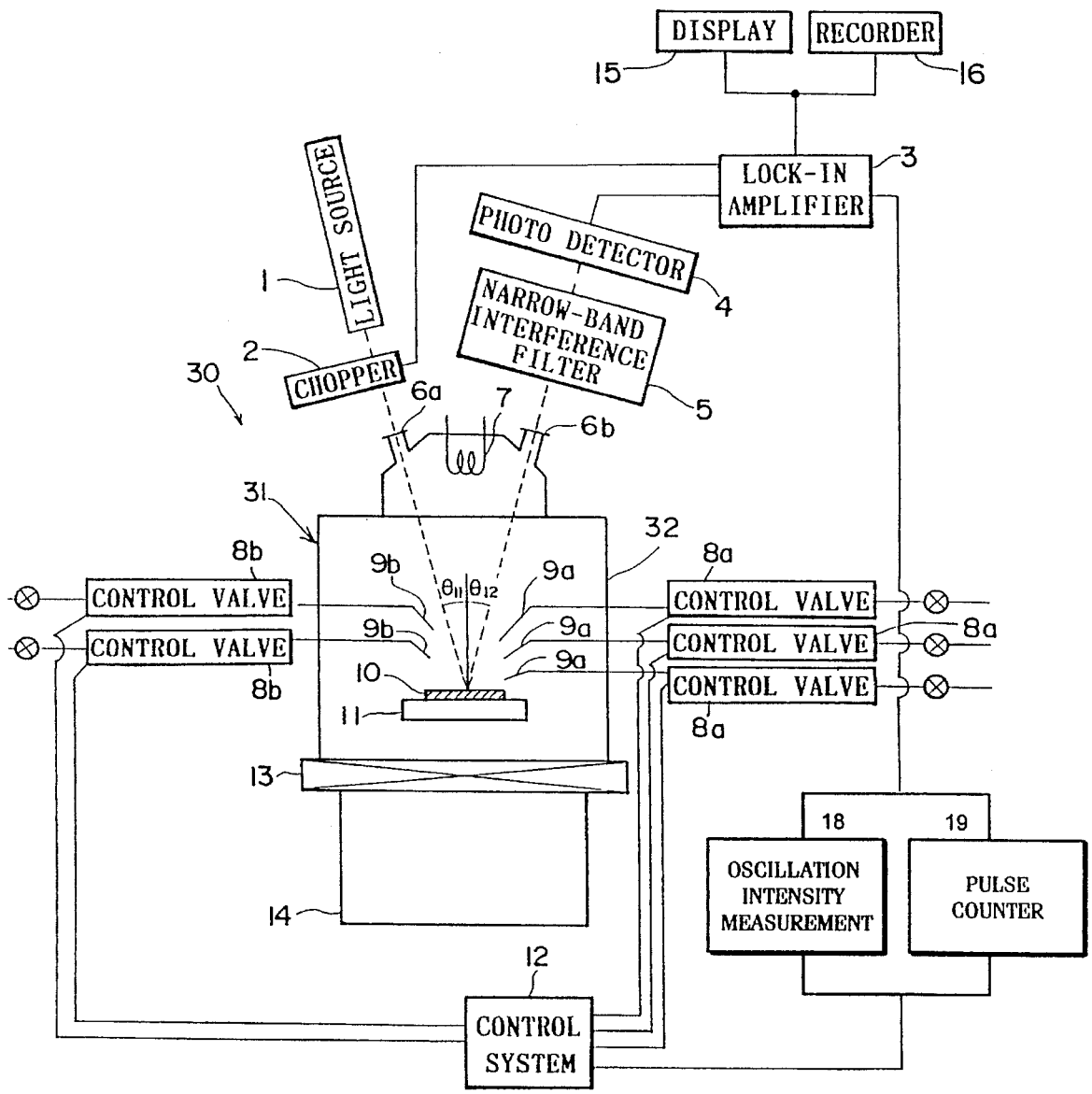
FIG. 1 is a schematic view of an epitaxial growing apparatus for carrying out the epitaxial growing method for a chemical-compound crystal, according to a first embodiment of the invention, the epitaxial growing apparatus comprising a GaAs molecular-layer epitaxial growing device.

FIG. 1, shows an epitaxial growing apparatus which comprises a GaAs molecular-layer epitaxial growing device 30. The epitaxial growing device 30 is described in more detail in a paper [J. Nishizawa, H. Abe and T. Kurabayashi; J. Electrochem. Soc. 132 (1985) 1197–1200] written by Junichi Nishizawa et al, for example.

As shown in FIG. 1, the GaAs molecular-layer epitaxial growing device 30 comprises a hermetic or closed container 31 in which a closed crystal growing chamber 32 is defined.

For example, pressure within the crystal growing chamber 32 is evacuated, initially to $10^{-6}$ to $10^{-11}$ Torr and, thereafter, chemical-compound gas that is the raw material is introduced into the crystal growing chamber 32 at $10^{-1}$ to $10^{-7}$ Torr at a predetermined sequence while the crystal growing chamber 32 is evacuated. A gate valve 13 is arranged at a location below the closed container 31. A vacuum evacuation device 14 such as a turbo molecular pump or the like is arranged at a location below the gate valve 13. The crystal growing chamber 32 is arranged at a location above the gate valve 13. A GaAs single-crystal substrate susceptor 11 and a GaAs single-crystal substrate 10 are contained within the crystal growing chamber 32. Further, within the crystal growing chamber 32, a plurality of raw-material-gas introducing nozzles 9a and a plurality of impurity-gas introducing nozzles 9b are arranged in opposed relation to each other and facing to the GaAs single-crystal substrate 10. The raw-material-gas introducing nozzles 9a and the impurity-gas introducing nozzles 9b are provided with respective control valves 8a and 8b. These control valves 8a and 8b are connected to a control system 12.

Furthermore, a GaAs single-crystal substrate heating lamp 7 is arranged at an upper portion of the crystal growing chamber 32. An incident window 6a and an extracting window 6b, through which a light can pass, are provided at a periphery of the crystal growing chamber 32 and are arranged respectively on both sides of the GaAs single-crystal substrate heating lamp 7. The incident window 6a and the extracting window 6b are arranged as follows: the incident window 6a and the extracting window 6b are set at an angle such that the light passing through the incident window 6a and the extracting window 6b is brought to a predetermined incident angle $\Theta_{11}$ and a predetermined reflecting angle $\Theta_{12}$ with respect to the GaAs single-crystal substrate 10.

Thus light from a light source 1 is emitted to a growing film of the GaAs single-crystal substrate 10 from a predetermined direction. The light source 1 is arranged on the outside of the incident window 6a in facing relation thereto. The light source 1 emits a parallel beam such as an He-Ne laser, a semiconductor laser, a light-emitting diode, a mercury lamp or an argon ion laser. A chopper 2 for chopping the light is arranged between the incident window 6a and the light source 1. A photo detector 4 for the light reflected from the GaAs single crystal substrate 10 is arranged on the outside of the extracting window 6b in facing relation thereto. A narrow-band interference filter 5 for removing stray light from the reflected light is arranged between the extracting window 6b and the photo detector 4.

The chopper 2 nd the photo detector 4 are connected to a lock-in amplifier 3. The lock-in amplifier 3 is provided with a display 15 and a recorder 16. The lock-in amplifier 3 is connected to the control system 12 via an oscillation intensity measurement device 18 and pulse counter 19.

The epitaxial growing method for the chemical-compound crystal is conducted using GaAs in the molecular-layer epitaxial growing device 30 as follows.

First, the control valves 8a and 8b for the impurity gas and the raw-material gas are controlled by the control system 12. By doing so, the raw-material gas containing Ga and the raw-material gas containing As are alternately introduced into the crystal growing chamber 32 and are directed onto the GaAs single-crystal substrate 10 which is controlled in temperature by the GaAs single-crystal substrate heating lamp 7, so that GaAs is epitaxially grown.

The reflected-light intensity at the GaAs crystal surface is measure as follows. That is, first, the light from the light source 1 arranged on the outside of the closed container 31 is chopped by the chopper 2. The light chopped is emitted to the GaAs single crystal through the incident window 6a. The light reflected is detected by the photo detector 4 such as a Si photodiode or the like, through the other extracting window 6b. The filter 5 is arranged between the photo detector 4 and the extracting window 6b, and removes the stray light from the light incident upon the photo detector 4 before the detection. A detecting output from the photodetector 4 is processed in signal by the lock-in amplifier 3. Subsequently, outputs are successively issued from the lock-in amplifier 3 to the control system 12, the display 15 and the recorder 16.

Figure 2:
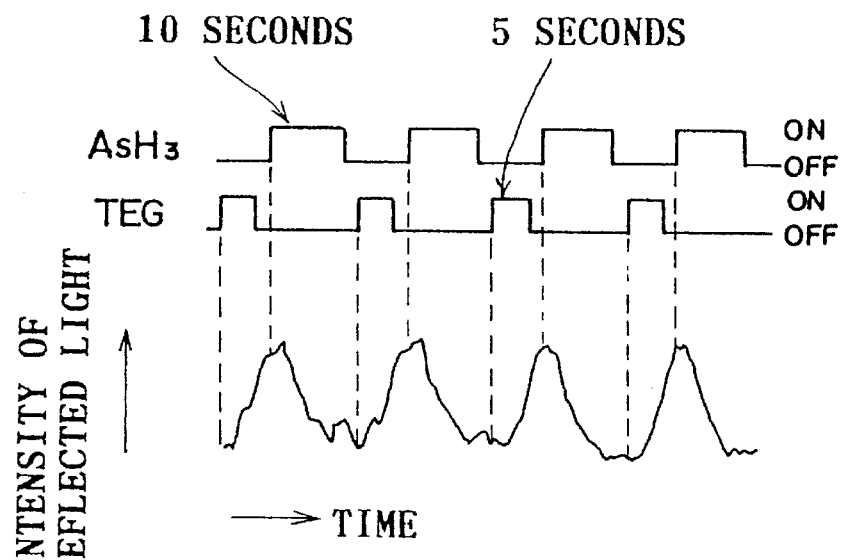
FIG. 2 is a view showing the change in reflected-light intensity observed while growing a GaAs crystal using the epitaxial growing apparatus illustrated in FIG. 1.

FIG. 2 shows the introduction sequence of the raw-material gases related to the change in the reflected-light intensity observed when GaAs is epitaxially grown in the GaAs molecular-layer epitaxial growing device 30 illustrated in FIG. 1.

As shown in FIG. 2, the reflected-light intensity increases with introduction of triethylgallium (TEG) which is used as the raw-material gas containing Ga, while the reflected-light intensity decreases with introduction of arsine ($AsH_3$) which is used as the raw-material gas containing As.

Figure 3:
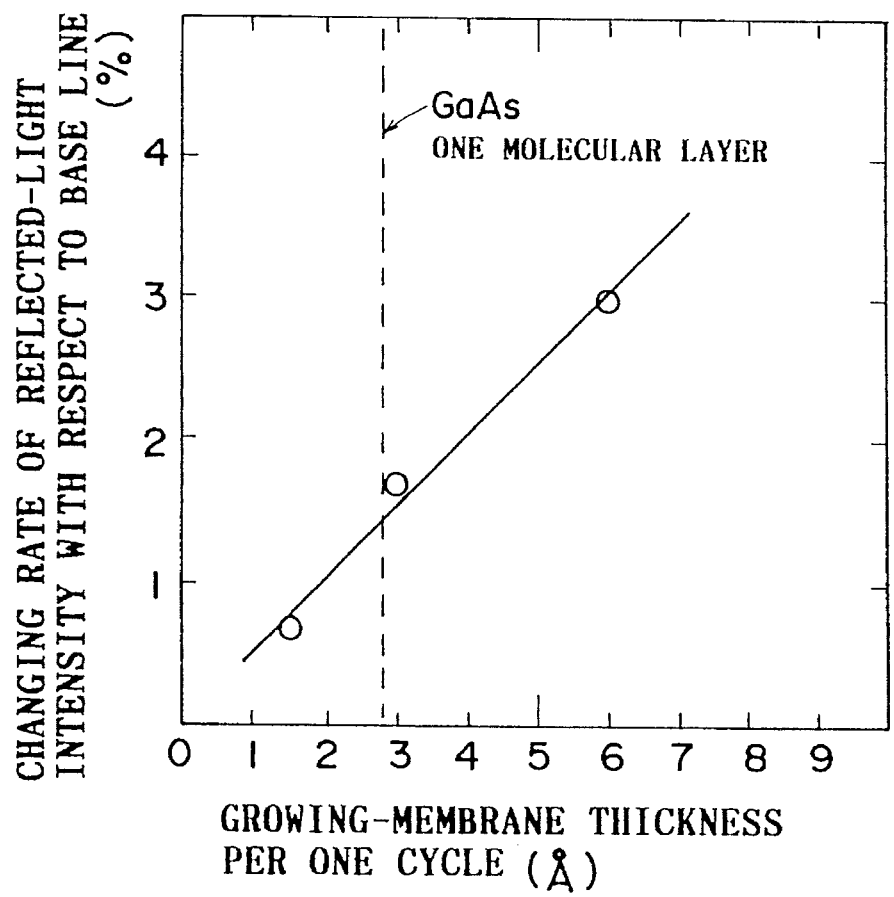
FIG. 3 is a graph showing the relationship between the changing rate of the reflected-light intensity and growing-film thickness per one cycle.

Further, FIG. 3 shows the mutual relationship between the growing-film thickness per single cycle and a changing rate of the reflected-light intensity with respect to a base line which is observed when GaAs is epitaxially grown by the GaAs molecular-layer epitaxial growing device 30 illustrated in FIG. 1.

This mutual relationship between the growing-film thickness per one cycle and the changing rate of the reflected-light intensity is used to measure a change of the reflected-light intensity illustrated in FIG. 2. On the basis of the measurement value, the introducing pressure and the introducing time of the raw-material gases are regulated or controlled. The growing rate of the growing film is controlled at accuracy equal to or lower than the monomolecular layer during growth of the crystal.

According to the present invention, a light of an appropriate wavelength is irradiated onto the surface of a semiconductor during the process of crystal growth. The adsorption of a mono-atomic layer of material gas or decomposed gas onto the surface of the semiconductor is ascertained by measuring the change in intensity of the reflected light. Furthermore, as illustrated in FIG. 2, the intensity of the reflected light is vibrated as the crystal grows molecular layer by molecular layer (atomic layer by atomic layer). Also, as shown in FIG. 3, the amount of film growth occurring during a single cycle of gas introduction can be determined by monitoring the difference between the top and bottom of the intensity of the reflected light.

In other words, according to the present invention, the film growth per one cycle is determined based on the intensity of a light pulse signal and the number of layers grown is determined from the number of pulse signals. Therefore, by counting the number of the pulse signals, film growth is monitored per unit of molecular layer (atomic layer) with the development of the growth per molecular layer (atomic layer).

For example, in FIG. 1, the growing rate of the growing film is controlled at an accuracy equal to or lower than a monomolecular layer such that the output from the lock-in amplifier 3 is inputted to the control system 12, the desirable change in intensity corresponding to the growing-film thickness per one cycle is beforehand stored in the control system 12, and the introduction of the raw material gases stops when a change in the output from the lock-in amplifier 3 reaches a preset value of the stored intensity change. Thus, it is possible to produce the desired growing-film thickness.

Figure 4:
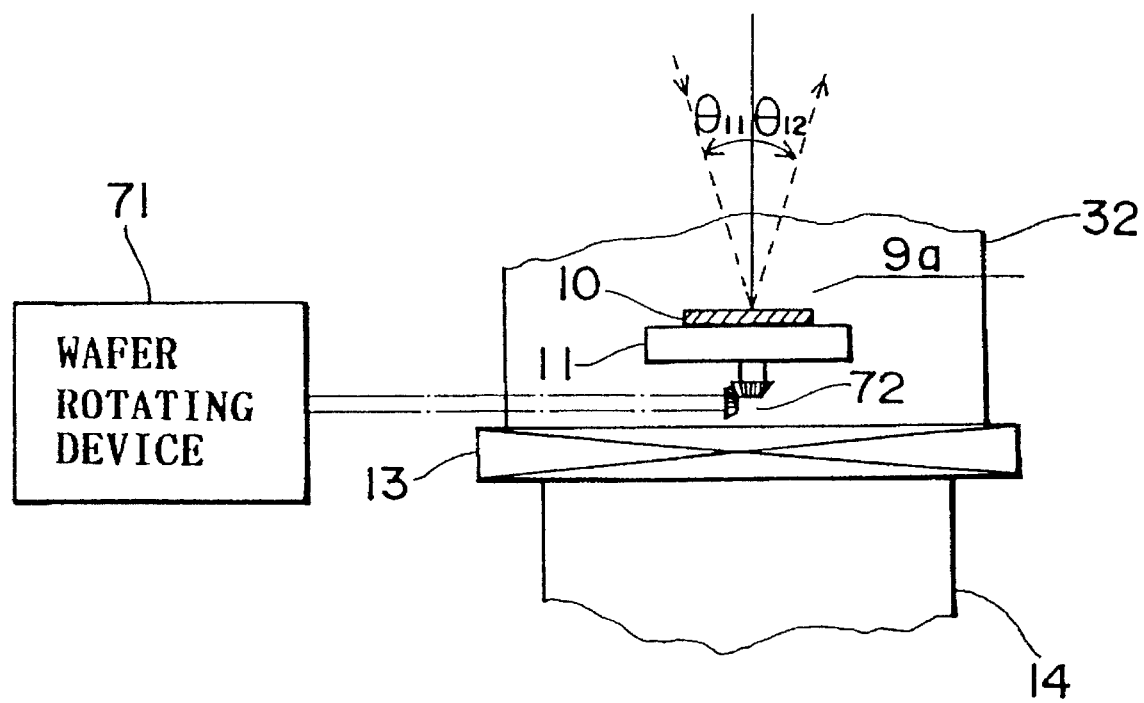
FIG. 4 is a schematic fragmentary view of a first modification of the epitaxial growing apparatus illustrated in FIG. 1.

In the apparatus illustrated in FIG. 1, the substrate susceptor 11 is fixedly mounted to the periphery of the crystal growing chamber 32. As illustrated in FIG. 4, which shows a first modification of the epitaxial growing apparatus, however, the substrate susceptor 11 may be connected to a wafer rotating device 71 through a gear train 72, so that the substrate 10 on the substrate susceptor 11 can be rotated about the vertical axis by the wafer rotating device 71. In the first modification illustrated in FIG. 4, even if the crystal is grown while rotating the crystal substrate, a direction of the light from the light source 1 and a direction of the light reflected from the substrate 10 do not change with respect to the vertical crystal axis. Thus, it is possible to control the thickness of the growing film of the crystal accurately.

Figure 5:
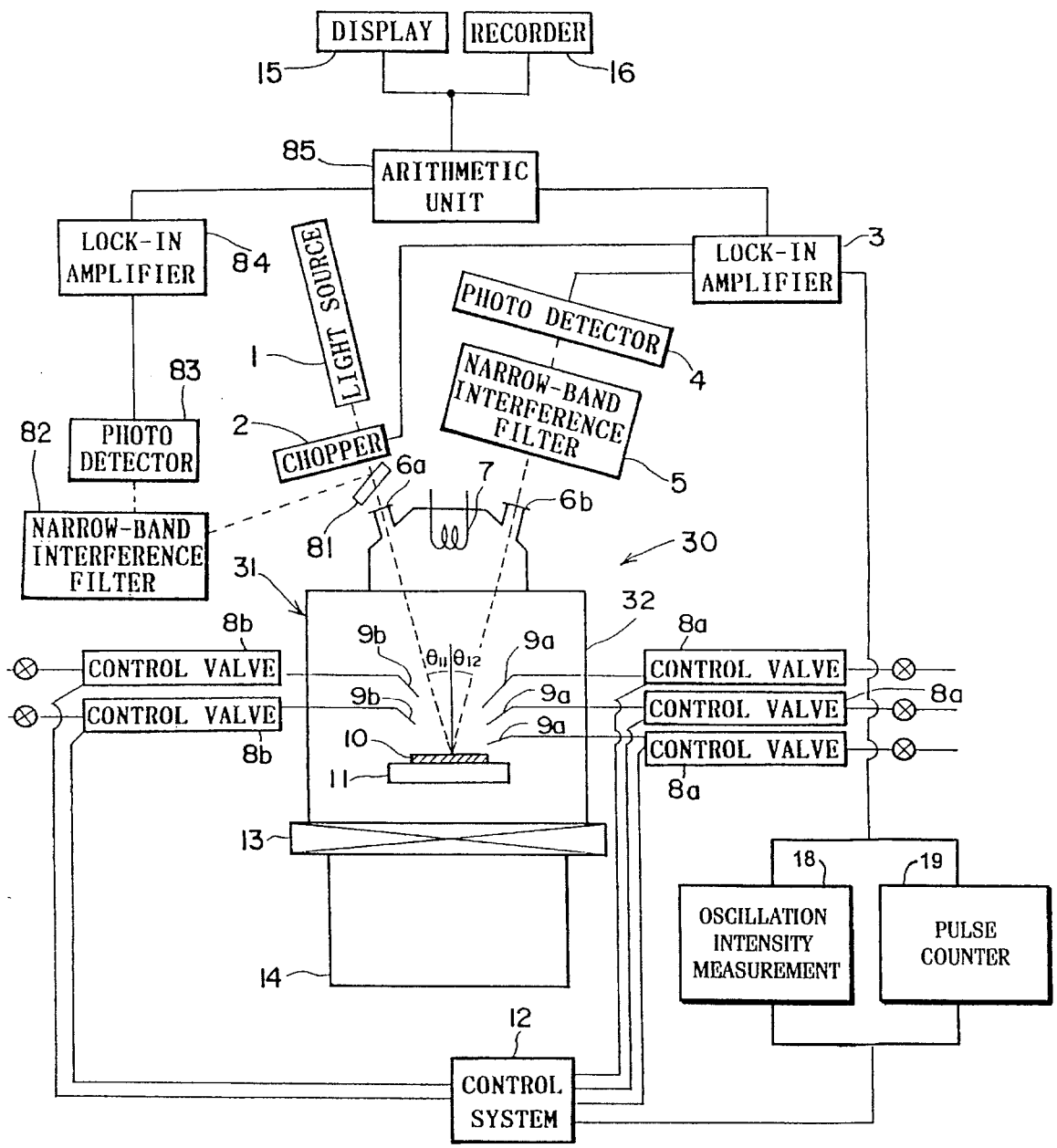
FIG. 5 is a schematic view of a second modification of the epitaxial growing apparatus illustrated in FIG. 1.

FIG. 5 shows a second modification of the apparatus illustrated in FIG. 1. In the second modification illustrated FIG. 5, a half-transparent mirror or a half-silvered mirror 81 is arranged between the chopper 2 and the incident window 6a. A photodetector 83 is arranged in facing relation to the half-silvered mirror 81, and a narrow-band interference filter 82 is arranged between the half-silvered mirror 81 and the photodetector 83. The photo detector 83 is connected to a lock-in amplifier 84. The lock-in amplifier 84 and the lock-in amplifier 3 are connected to an arithmetic unit 85. The display 15 and the recorder 16 are connected to the arithmetic unit 85. The control system 12 is connected to lock-in amplifier via an oscillation intensity measurement device 18 and pulse counter 19.

In the epitaxial growing apparatus illustrated in FIG. 5, a portion of the light emitted from the light source 1 is reflected by the half-silvered mirror 81. The remaining light passes through the half-silvered mirror 81 and is incident upon the substrate 10 through the incident window 6a. That is, the light portion is extracted from the light incident upon the substrate 10. The light portion serves as a reference light. The light portion reflected by the half-silvered mirror 81 is incident upon the photo detector 83 through the narrow-band interference filter 82. The lock-in amplifier 84 connected to the photo detector 83 issues an output on the basis of the light incident upon the photodetector 83. At the arithmetic unit 85, the reference light is compared with the reflected light incident upon the photodetector 4, in order to reduce instability in output from the light source 1. Thus, it is possible to control the growing rate to a further degree of high accuracy.

FIG. 6 shows an epitaxial growing apparatus according to a second embodiment of the invention. The epitaxial growing apparatus includes a crystal growing device 130 which may be a MO-CVD (metal organic-chemical vapor deposition) device, a chloride-method gas-phase growing device or a hydride epitaxial growing device. These devices are different from each other in terms of the gases utilized. That is, $AsCl_3$ and $H_2$ are used in the chloride-method gas-phase growing device. HCl, $H_2$, $As_2$ and $As_4$ are utilized in the hydride epitaxial growing device. $Ga(CH_3)_3$, $AsH_3$ and $H_2$ are employed in the MO-CVD device.

As shown in FIG. 6, the crystal growing device 130 includes a cylindrical quartz reaction tube 120 in which a closed chamber 141 is defined. Pressure within the closed chamber 141 is maintained at normal pressure or atmospheric pressure up to $10^{-2}$ Torr, for example. The quartz reaction tube 120 has one end provided with a gas introduction port 133, and the other end provided with a gas discharge port 134. Connected to the gas introduction port 133 is a supply nozzle 121 for supplying gases including GaAs crystal-growing raw material gases and dopant. A plurality of control valves 123 are connected to the gas supply nozzle 121 and are also connected to a control system 112.

Further a quartz susceptor 118 and a GaAs single-crystal substrate 117 are contained in the quartz reaction tube 120; that is, they are placed within the closed chamber 141. A cylindrical heater 119 is arranged about the quartz reaction tube 120. An incident window 122a and an extraction window 122b, through which a light can pass, are arranged at their respective locations on both sides of the heater 119 and above the same. The incident window 122a and the extracting window 122b are arranged as follows: both windows 122a and 122b are set at angle such that the light passing through the incident window 122a and the extracting window 122b is brought to a predetermined incident angle $\Theta_{21}$ and a predetermined reflecting angle $\Theta_{22}$ with respect to the GaAs single-crystal substrate 117.

In this arrangement light from a light source 101 is emitted onto a growing film of the GaAs single-crystal substrate 117 from a predetermined direction. The light source 101 is arranged on the outside of the incident window 122a in facing relation thereto. The light source 101 provides a parallel beam of light and may be an HeNe laser, a semiconductor laser, a light-emitting diode, a mercury lamp or an argon ion laser. A chopper 102 for chopping the light from the light source 101 is arranged between the incident window 122a and the light source 101. A photo detector 104 for light reflected from the substrate 117 is arranged on the outside of the extracting window 122b in facing relation thereto. A narrow-band interference filer 105 for removing (filtering) stray light from the reflected light is arranged between the extracting window 122b and the photo detector 104.

The chopper 102 and the photo detector 104 are connected to a lock-in amplifier 103. The lock-in amplifier 103 is provided with a display 115 and a recorder 116. The lock-in amplifier 103 is connected to the control system 112 via an oscillation intensity measurement device 118 and pulse counter 119.

The crystal growing apparatus as described above is used to epitaxially grow a chemical-compound crystal as follows:

First, gas introduction time and evacuation time of the quartz reaction tube 120 are controlled by the control system 112. The raw-material gas containing Ga and the raw-material gas containing As are alternately supplied onto the GaAs single crystal substrate 117. In this manner, GaAs is epitaxially grown.

As the crystal grows, the light from the light source 101 is reflected by the GaAs single-crystal substrate 117, and intensity of the reflected light is measured by the photo detector 104 such as a Si photodiode or the like. A detection output of the reflected-light intensity from the photo detector 104 is processed as a signal by the lock-in amplifier 103. Subsequently, outputs are successively issued from the lock-in amplifier 103 to the display 115 and the recorder 116.

Further, the output from the lock-in amplifier 103 is inputted also to the control system 112. If a change in the reflected-light intensity corresponding to the desired growing-film thickness per single cycle is reached, the control valve 123 is closed to stop introduction of the GaAs crystal growing raw-material gases and the gas containing the dopant, thereby controlling the growing rate of the growing-film thickness. Thus, the desired growing-film thickness is attained.

The method according to the second embodiment of the invention can equally be applied to gas-phase growth using $GaCl_3$ and $AsH_3$, chloride-method gas-phase growth due to $Ga-AsCl_3-H_2$, and hydride-method gas-phase growth using $Ga-AsH_3-HCl$.

Although not specifically shown, the arrangements illustrated in FIGS. 4 an 5 are equally applicable to the arrangement illustrated in FIG. 6.

FIG. 7 shows an epitaxial growing apparatus according to a third embodiment of the invention. The epitaxial growing apparatus includes a molecular-beam epitaxial growing device 230 which is one of GaAs gas-phase growing devices.

As shown in FIG. 7, the molecular-beam epitaxial growing device 230 includes a hermetic or closed container 241 in which a super-high vacuum growing chamber 226 is defined. Pressure within the super-high vacuum chamber 226 is maintained at $10^{-4}$ to $10^{-11}$ Torr, for example. A vacuum evacuation device 229 such as an ion pump, a turbo molecular pump or the like is connected to a bottom of the super-high vacuum growing chamber 226. A substrate heater 224 is arranged at a ceiling within the super-high vacuum growing chamber 226. A GaAs single-crystal substrate 225 is arranged adjacent the substrate heater 224 and facing downwardly.

Further, a plurality of raw-material heating crucibles 227 are fixedly supported on the bottom within the super-high vacuum growing chamber 226. A plurality of shutters 228 for controlling supply of molecular beams or raw-material gases are provided respectively at openings of the respective raw-material heating crucibles 227. An incident window 229a and an extraction window 229b, through which light can pass, are arranged respectively at opposed side walls of the super-high vacuum growing chamber 226. The incident window 229a and the extracting window 229b are arranged as follows: the incident window 229a and the extracting window 229b are set at an angle such that the light passing through the incident window 229a and the extracting window 229b is brought to a predetermined incident angle $\Theta_{31}$ and a predetermined reflecting angle $\Theta_{32}$ with respect to the GaAs single-crystal substrate 225.

That is, the arrangement is such that light from a light source 201 is emitted onto a growing film of the GaAs single-crystal substrate 225 from a predetermined direction. The light source 201 is arranged on the outside of the incident window 229a in facing relation thereto. The light source 201 is a parallel light beam such as that emitted from an He-Ne laser, a semiconductor laser, a light-emitting diode, a mercury lamp or an argon ion laser. A chopper 202 for chopping the light is arranged between the incident window 229a and the light source 201.

A photo detector 204 for the light is arranged on the outside of the extracting window 229b in facing relation thereto. A narrow-band interference filter 205 for removing stray light from the light reflected from the substrate 225 is arranged between the extracting window 229b and the photo detector 204. The chopper 202 and the photo detector 204 are connected to a lock-in amplifier 203. The lock-in amplifier 203 is provided with a display 215 and a recorder 216. The lock-in amplifier 203 is connected to a control system 212.

The control system 212 is connected to an electric system for the super-high vacuum growing chamber 226. The electric system is connected in line to various attachment devices such as the shutters 228 and the like which are mounted within the super-high vacuum growing chamber 226.

The epitaxial growing apparatus according to the third embodiment of the invention, is used to epitaxially grow chemical-compound crystals as follows.

First, opening and closing of the shutters 228 is controlled by the control system 212. The raw materials within the respective crucibles 227 are heated respectively by the heaters 227, and the raw-material gases are emitted from the crucibles 227 toward the substrate 225 when the shutters 228 are moved to their respective open positions. Raw material gases Ga and As are alternately supplied onto the GaAs single-crystal substrate 225. In this manner, GaAs is epitaxially grown.

The reflected-light intensity is measured as follows: the light from the light source 201 arranged on the outside of the molecular-beam epitaxial growing device 230 is chopped by the chopper 202. Subsequently, the light is applied to the GaAs single-crystal substrate 225 through the incident window 229a. The light reflected from the substrate 225 is emitted toward the photo detector 204 through the extracting window 229b, and is measured by the photo detector 204 such as an Si photodiode or the like which is arranged on the outside of the molecular-beam epitaxial growing device 230. At the measurement due to the photo detector 204, a stray light is attenuated by the narrow-band interference filter 205 which is arranged between the photo detector 204 and the extracting window 229b.

A detection output from the photo detector 204 is processed as a signal by the lock-in amplifier 203. Subsequently, outputs are successively issued from the lock-in amplifier 203 to the display 215 and the recorder 216.

Simultaneously, the output from the lock-in amplifier 203 is also inputted to the control system 212. The desired changing rate in the reflected-light intensity corresponding to the growing-film thickness per one cycle is stored in the control system 212. If the changing rate of the output from the lock-in amplifier 203 reaches a value of the stored desirable changing rate, the shutters 228 are closed.

Although not specifically shown, the arrangements illustrated in FIGS. 4 and 5 are equally applicable to the arrangement illustrated in FIG. 7.

As described above, in all three embodiments of the invention, the growing rate of the growing-film thickness is controlled during growth of the crystal in the manner mentioned previously. Thus, it is possible to produce a desirable crystal-film thickness at a level of accuracy equal to or lower than a monomolecular layer.

Furthermore, the conventional RHEED process which uses electron-beam diffraction, in which it is necessary that the direction of the crystal axis and the direction of the high-energy electron beam are aligned with each other. Thus, it is impossible for the conventional RHEED process to grow a crystal while rotating the GaAs single-crystal substrate 10, 117 or 225. In the method and apparatus according to the invention, however, since the change in the reflected-light intensity has no relationship to the crystal axis, it is possible to grow the crystal while rotating the GaAs single-crystal substrate 10, 117 or 225 and it is also possible to secure uniformity in the plane of the crystal film.

According to this feature of applicants' invention, intensity of reflected light is vibrated as the crystal grows molecular layer by molecular layer (atomic layer by atomic layer) as illustrated in FIG. 2. Also, as shown in FIG. 3, film growth during one cycle of gas introduction can be obtained by monitoring the difference between the top and bottom of the intensity of reflected light.

In other words, in the applicants' invention, film growth per one cycle is determined based on intensity of a light pulse signal, and the number of grown layers is determined from the number of the pulse signals. By counting the number of the pulse signals, film growth is monitored per unit of a molecular layer (atomic layer).

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. An apparatus for epitaxially growing a chemical-compound crystal comprising:

a crystal growing device having defined therein a closed chamber and a vacuum evacuation device for reducing the pressure in said closed chamber to $10^{-6}$ to $10^{-11}$ Torr in communication with said closed chamber, said chemical compound being placed within said closed chamber;

a crystal rotating device for rotating said chemical compound crystal at a predetermined speed;

a heating lamp outside of the crystal growing chamber directed onto a crystal growing film;

a plurality of nozzles in a facing relationship to said crystal for is alternately introducing a plurality of raw-material gases into said closed chamber to grow said crystal;

a plurality of nozzles in a facing relationship to said crystal for introducing impurity gas into said closed chamber, said raw-material gas introducing nozzles and impurity gas introducing nozzles arranged opposite each other;

incident window means provided at a periphery of said closed chamber; p1 light-source means emitting a predetermined wavelength light which is reflected through said crystal, said light source means being arranged on the outside of said closed chamber in facing relation to said incident window means, for emitting a light to a crystal growing film of said crystal through said incident window means;

extracting window means provided at the periphery of said closed chamber;

light-receiving means having a predetermined angle to receive reflected light and exclude incident light, said light receiving means being arranged on the outside of said closed chamber in facing as relation to said extracting window means;

means for measuring intensity of said reflected light;

oscillation intensity measurement means for measuring the light oscillation intensity;

pulse counter means for measuring the light oscillation; and control means for controlling charge amounts of the respective raw-material gases on the basis of a change in the reflected-light intensity, thereby controlling the growth rate and the number of layers of the monomolecular layer film of said crystal.

2. The apparatus according to claim 1 wherein said light-source means is a source of a parallel beam.

3. The apparatus according to claim 2, wherein said source of the parallel beam is a semiconductor laser, a light-emitting diode, a mercury lamp or an argon ion laser.

4. The apparatus according to claim 1, further comprising filter means arranged between said extracting window means and said light receiving means, for cutting off a stray light from said reflected light.

5. The apparatus according to claim 4, wherein said filter means is a band interference filter.

6. The apparatus according to claim 5, wherein said filter means is a narrow-band interference filter.

7. The apparatus according to claim 1, further comprising extracting means for extracting a portion of the light emitted onto said crystal growing film, said light portion sewing as a reference light, and means for comparing said reference light with the reflected light to control the growing rate of the growing film.

8. The apparatus according to claim 1, wherein the light from said light-source means is incident upon said crystal growing film of the crystal at a predetermined incident angle, and wherein the light from said light-source means is reflected from said crystal growing film with a predetermined reflecting angle and is incident upon said light-receiving means.

9. The apparatus according to claim 1, wherein one of said raw-material gases contain Ga, while another raw-material gas contains As.

10. The apparatus according to claim 1, wherein said crystal growing device comprises a cylindrical quartz reaction tube, said closed chamber is defined in said cylindrical quartz reaction tube, and wherein said cylindrical quartz reaction tube is provided, at one end thereof, with a gas introduction port through which said raw-material gases are introduced into said closed chamber, and said cylindrical quartz reaction tube is provided, at its other end, with a gas discharge port through which said raw-material gases are discharged out of said closed chamber.

* * * * *

UNITED STATES PATENT AND TRADEMARK OFFICE
CERTIFICATE OF CORRECTION

PATENT NO. : 5,525,156
DATED : June 11, 1996
INVENTOR(S) : MANADA et al

It is certified that error appears in the above-indentified patent and that said Letters Patent is hereby corrected as shown below:

Claim 1, column 10, line 26, delete "is";
                      line 35, delete "p1";
                      line 48, delete "as".

Signed and Sealed this

Seventh Day of January, 1997

Attest:

BRUCE LEHMAN

Attesting Officer        Commissioner of Patents and Trademarks

UNITED STATES PATENT AND TRADEMARK OFFICE
CERTIFICATE OF CORRECTION

PATENT NO. : 5,525,156
DATED : June 11, 1996
INVENTOR(S) : MANADA et al

It is certified that error appears in the above-indentified patent and that said Letters Patent is hereby corrected as shown below:

On the title page, under item [19], "Manada" should read --Nishizawa--.
On the title page, item [75] should read as follows:

[75] Inventors: Jun-Ichi Nishizawa, 6-16, Komegafukuro 1-chome, Aoba-ku Sendai-shi, Miyagi-ken, Nobuaki Manada, 1-24, Yagiyamaminami 1-chome, Taihaku-ku, Sendai-shi, Miyagi-ken; Junji Ito, 16-3, Yagiyamamidori-cho, Taihaku-ku, Sendai-shi Miyagi-ken; Toru Kurabayashi, 9-23, Yagiyamaminami 1-chome, Taihaku-ku, Sendai-shi, Miyagi-ken; all of Japan.

Signed and Sealed this

Thirteenth Day of May, 1997

*Attest:*

BRUCE LEHMAN

*Attesting Officer*     *Commissioner of Patents and Trademarks*